(12) United States Patent
Nogami et al.

(10) Patent No.: US 6,346,745 B1
(45) Date of Patent: Feb. 12, 2002

(54) CU-Al COMBINED INTERCONNECT SYSTEM

(75) Inventors: Takeshi Nogami, Sunnyvale; Susan H. Chen, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/205,587

(22) Filed: Dec. 4, 1998

(51) Int. Cl.[7] .................. H01L 23/48; H01L 23/52; H01L 29/40
(52) U.S. Cl. .................. 257/751; 257/762; 257/765
(58) Field of Search .................. 257/762, 761, 257/765, 751, 763, 764; 438/627, 653

(56) References Cited

U.S. PATENT DOCUMENTS

| | | | |
|---|---|---|---|
| 5,525,837 A | * 6/1996 | Choudhury | 257/751 |
| 5,693,563 A | 12/1997 | Teong | 438/627 |
| 5,893,752 A | * 4/1999 | Lin et al. | 438/687 |
| 6,140,231 A | * 4/1999 | Lin et al. | 438/653 |
| 6,001,730 A | * 12/1999 | Farkas et al. | 438/627 |

* cited by examiner

Primary Examiner—Phat X. Cao

(57) ABSTRACT

A combined interconnect system is formed comprising a Cu or Cu alloy feature electrically connected an Al or Al alloy feature through a composite comprising a first layer containing tantalum and aluminum contacting the Al or Al alloy feature, a second layer containing tantalum nitride, a third layer containing tantalum nitride having an nitrogen content less than that of the second layer, e.g. amorphous tantalum nitride, and a fourth layer comprising tantalum or tantalum nitride having a nitrogen content less than that of the third layer. Embodiments include forming a dual damascene opening in the dielectric layer exposing a lower Al or Al alloy feature, depositing a layer of tantalum in contact with the Al or Al alloy feature, sequentially depositing the second, third and fourth layers, filling the opening with Cu or Cu alloy layer, CMP and heating to diffuse aluminum from the underlying feature into the first tantalum layer.

20 Claims, 1 Drawing Sheet

US 6,346,745 B1

CU-Al COMBINED INTERCONNECT SYSTEM

TECHNICAL FIELD

The present invention relates to semiconductor devices comprising combined copper (Cu) or Cu alloy and aluminum (Al) or Al alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped monocrystalline silicon, and a plurality of sequentially formed interdielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing an inter-layer dielectric on a conductive layer comprising at least one conductive pattern, forming an opening in the interdielectric layer by conventional photolithographic and etching techniques, and filling the opening with a conductive material, such as tungsten (W). Excess conductive material on the surface of the interdielectric layer is removed by chemical-mechanical polishing (CMP). One such method is known as damascene and basically involves forming an opening and filling the opening with a metal. Dual damascene techniques involve forming an opening comprising a lower contact or via opening section in communication with an upper trench section, and filling the opening with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and the distance between interconnects decreases, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for Al in VLSI interconnection metallizations. Cu is relatively inexpensive, easy to process, has a lower resistivity than Al, and has improved electrical properties vis-a-vis W, making Cu a desirable metal for use as a conductive plug as well as conductive wiring.

An approach to forming Cu plugs and wiring comprises the use of damascene structures employing CMP, as in Tenog, U.S. Pat. No. 5,693,563. However, due to Cu diffusion through the interdielectric layer, Cu interconnect structures must be encapsulated by a diffusion barrier layer. Typical diffusion barrier metals include tantalum (Ta), tantalum nitride (TaN), titanium (Ti), titanium nitride (TiN), titanium tungsten (TiW), and silicon nitride ($Si_3N_4$) for encapsulating Cu. The use of such barrier materials to encapsulate Cu is not limited to the interface between Cu and the interdielectric layer, but includes interfaces with other metals as well.

There are additional problems attendant upon conventional methodology in forming a combined interconnect system comprising a Cu or Cu alloy feature electrically connected to an Al or Al alloy feature. For example, in a chip with circuit interconnections comprising a mixture of Cu or Cu alloy features and Al or Al alloy features, such as Cu interconnects and Al vias or Al interconnects and Cu vias, Cu and Al must be isolated by effective barrier material to prevent Kirkendal voiding. Conventional barrier layer materials, such as Ta or TaN have a low nitrogen content, e.g., a nitrogen content less than about 50 at. %, and can not serve as effective diffusion barriers for both Al and Cu. Thus, it is difficult to simultaneously satisfy the requirements of both Cu and Al in forming a combined Cu—Al interconnect structure.

There exists a need for a reliable Cu or Cu alloy-Al or Al alloy combined interconnect structure. There also exists a need for methodology enabling the formation of a reliable Cu or Cu alloy-Al or Al alloy interconnect structure with high electromigration resistance and optimal barrier properties against

DISCLOSURE OF THE INVENTION

An advantage of the present invention is a semiconductor device comprising a reliable Cu or Cu alloy-Al or Al alloy combined interconnect structure having high electromigration resistance and high resistance to Cu and Al diffusion.

Another advantage of the present invention is a method of manufacturing semiconductor device comprising a Cu or Cu alloy-Al or Al alloy combined interconnect structure having high electromigration resistance and high resistance to Cu or Al diffusion.

Additional advantages and other features of the present invention are set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by semiconductor device comprising: an aluminum (Al) or Al alloy feature; a copper (Cu) or Cu alloy feature electrically; and a composite electrically connecting the Al or Al alloy feature to the Cu or Cu alloy feature, the composite comprising: a first layer comprising Ta and Al in contact with a surface of the Al or Al alloy feature; a second layer comprising TaN on the first layer; a third layer comprising TaN having a nitrogen content less than that of the TaN of the second layer, on the second layer; and a fourth layer, comprising Ta or TaN having a nitrogen content less than the TaN of the third layer, on the third layer and in contact with a surface the Cu or Cu alloy feature.

Another aspect of the present invention is a method of manufacturing a semiconductor device, the method comprises forming an aluminum (Al) or Al alloy feature; forming a composite comprising; a first layer comprising Ta in contact with the surface of the Al or Al alloy feature; a second layer comprising TaN on the first layer; a third layer, comprising TaN having a nitrogen content less the TaN of the second layer, on the second layer; and a fourth layer, comprising Ta or TaN having a nitrogen content less than the TaN of the third layer, on the third layer; and forming a copper (Cu) or Cu alloy feature electrically connected to the Al or Al alloy feature by the composite. Heating is then conducted to diffuse Al from the Al or Al alloy feature into the first tantalum layer.

Embodiments include forming a dual damascene opening in a dielectric layer in communication with a lower Al or Al alloy feature, depositing the first layer of Ta at a thickness of about 10 Å to about 100 Å, depositing the second layer of TaN having a nitrogen content of about 30 to about 70 at. % at a thickness of about 150 Å to about 250 Å depositing the third layer of TaN having a nitrogen content of about 15 at. % to about 50 at. % at a thickness of about 150 Å to about 250 Å, and depositing the fourth layer of Ta or TaN having a nitrogen content less than about 15 at. % at a thickness of about 50 Å to about 150 Å. Embodiments also include depositing a second layer of polycrystalline TaN and a third layer of essentially amorphous TaN. Cu or a Cu alloy is then deposited to fill the dual damascene opening. Subsequently, planarization is conducted by CMP to form an upper Cu or Cu alloy line and via electrically connected to the lower Al or Al alloy line through the composite layers. Upon, subsequent heating, Al diffuses from the Al or Al alloy feature into the first tantalum layer. Other embodiments include electrically connecting an upper Al or Al alloy line and via to a lower Cu or Cu alloy line through the composite layers in reverse sequence. In connecting an Al or Al alloy via to a lower Cu or Cu alloy line, the manipulative steps are reversed, i.e., and the fourth layer is initially deposited, the third layer is deposited on the fourth layer, the second layer is deposited on the third layer and the first layer is deposited on the second layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
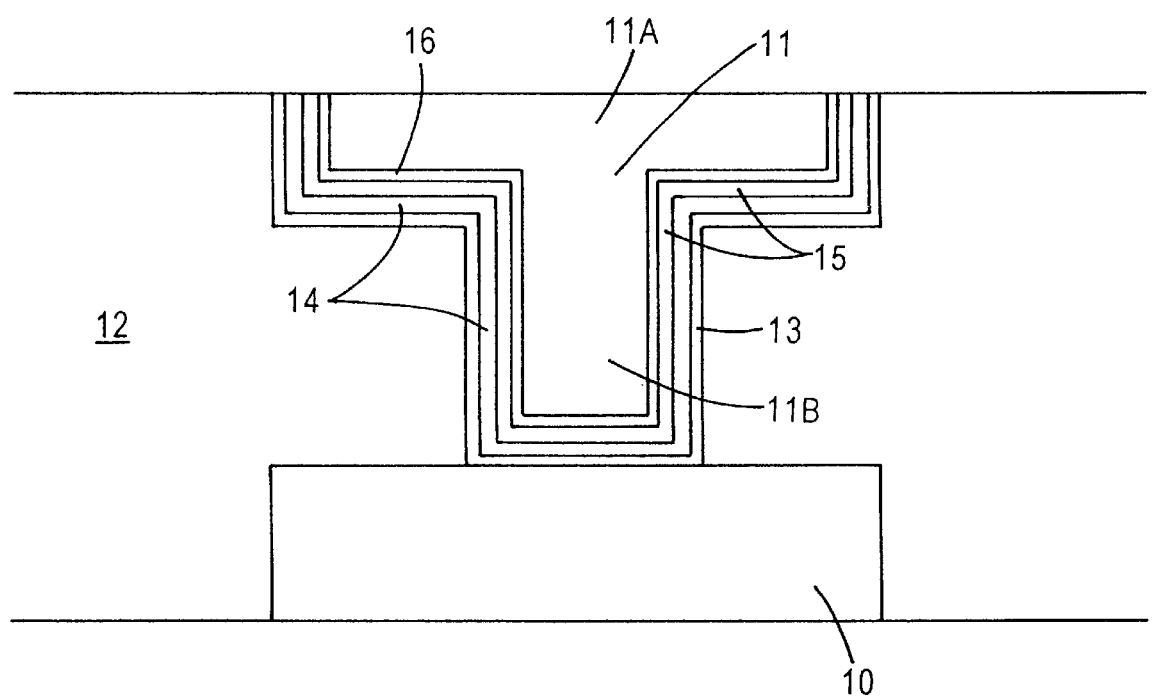
FIG. 1 schematically illustrates a combined Cu or Cu alloy-Al or Al alloy interconnect structure in accordance with an embodiment of the present invention.

The present invention addresses and solves electromigration resistance and diffusion problems attendant upon forming a combined interconnect structure comprising an Al or Al alloy feature electrically connected to a Cu or Cu alloy feature. As employed throughout this application, the symbol Al is intended to encompass high purity elemental Al as well as Al-based alloys conventionally employed in manufacturing semiconductor devices, such as Al alloys containing minor amounts of Cu and tin (Sn). As employed throughout this application, the symbol Cu is intended to encompass high purity elemental copper as well as Cu-based alloys, such as Cu alloys containing minor amounts of zinc (Zn), manganese, (Mn), titanium (Ti) and germanium (Ge).

In accordance with the present invention, a composite structure is formed to electrically connect an Al or Al alloy feature to a Cu or Cu alloy feature. It should be understood that the present invention is applicable to interconnections including Cu or Cu alloy lines and Al or Al alloy vias or Al or alloy lines and Cu or Cu alloy vias. The inventive composite structure formed to electrically connect Cu and Al features prevents Kirkendal voiding, provides high electromigration resistance, minimizes resistivity, and provides high resistance to diffusion to both Cu and Al. Accordingly, the present invention enables the manufacture of a semiconductor device comprising defect free, low resistance Cu—Al junctions.

Embodiments of the present invention comprise forming a four layer composite structure between the Al and Cu features. The four layer structure comprises a first layer of Ta—Al in contact with the Al feature. A second layer comprising TaN is formed on the first layer. A third layer, comprising TaN, having a nitrogen content greater than that of the second layer, is formed on the second layer. A fourth layer, comprising Ta or Ta-rich TaN having a nitrogen content less than that of the third layer, is formed on the third layer. The Cu feature is then formed in contact with the fourth layer of the inventive composite. The first layer is formed as a Ta layer. Heating is conducted to diffuse Al from the Al feature into the first layer.

Embodiments of the present invention include forming a first layer of Ta in contact with the Al or All alloy feature at about a thickness of 10 Å to about 100 Å, forming a second layer of TaN at a thickness of about 20 Å to about 250 Å on the first layer, forming a third layer of TaN at a thickness of about 20 Å to 250 Å on the second layer, and forming a fourth layer of Ta or TaN at a thickness of about 10 Å to about 150 Å on the third layer. Embodiments also include forming the second layer of TaN having a nitrogen content of about 30 at. % to about 70 at. % on the first layer, forming the third layer of TaN having a nitrogen content of about 15 at. % to about 50 at. % on the second layer and forming the fourth layer of Ta or TaN having a nitrogen content less than about 15 at. % on the third layer. Embodiments also include forming the second layer of polycrystalline TaN on the first layer and forming the third layer of essentially amorphous tantalum nitride on the second layer.

In embodiments of the present invention involving electrically connecting an Al or Al alloy feature to an underlying Cu or Cu alloy feature, the layers are deposited in the reverse order. Thus, the fourth layer of Ta or Ta-rich TaN is initially deposited on the Cu or Cu alloy feature, followed by sequentially depositing the third TaN layer, second TaN layer and fourth Ta layer. The Al or Al alloy feature is then formed in contact with the first Ta layer. Upon subsequent annealing, Al form the Al or Al alloy feature diffuses into the first Ta layer. The formation of a thin Ta—Al layer on the surface of the Al or Al ally feature reduces the resistivity of the interconnection by substantially preventing Al diffusion and reaction with Ta or nitrogen in the other layers of the composite.

Embodiments of the present invention comprise depositing the first, second, third, and fourth layers by sputtering in a single sputter deposition chamber comprising a Ta target and adjusting the amount of nitrogen in the sputter deposition chamber to form the second, third, and fourth layers having different nitrogen contents. The first layer is initially deposited as Ta. During heating or subsequent processing involving heating, as by depositing a subsequent dielectric layer of silicon oxide, e.g. at a temperature about 350° C., Al from the Al or Al alloy feature diffuses into the Ta layer.

The present invention comprises the formation of a composite comprising four layers strategically designed to provide a high integrity interconnect with superior electromigration resistance, reduced via resistivity and high resistance to Cu and Al diffusion. The first layer of Ta, which is in contact with the Al or Al alloy feature, is strategically formed at a low thickness, e.g. about 10 Å to about 100 Å, and advantageously minimizes via resistivity by forming a diffusion barrier layer which prevents Al from further reaction with Ta or nitrogen in the other layers of the composite. The second layer comprising polycrystalline TaN contains a relatively high nitrogen content, e.g. about 30 at. % to about 70 at. %, and effectively prevents intermixing of Al and Cu to achieve a defect free, low resistivity Cu—Al junction. The third layer comprising TaN having a nitrogen content less than that of the second layer, e.g. about 15 at. % to about 50 at. %, can be optimized by providing an amorphous microstructure, thereby optimizing the barrier properties against Cu diffusion. The fourth layer of Ta or TaN having a nitrogen content less than 15 at. % enhances the adhesion of Cu to the third layer, thereby improving electromigration resistance.

Embodiments of the present invention comprise depositing a dielectric layer on an Al or Al alloy feature or on a Cu or Cu alloy feature, and forming a dual damascene opening in the dielectric layer. If the damascene opening is formed over an Al or Al allow feature, the layers are sequentially deposited as the previously mentioned first, second, third and fourth layers. However, in exposing a lower Cu or Cu alloy feature, the layers are sequentially deposited as the fourth layer, third layer, second layer and first layer.

An embodiment of the present invention comprising a combined Cu or Cu alloy-Al or Al alloy interconnect structure is schematically illustrated in FIG. 1 and comprises lower Al or Al alloy line 10. Reference numeral 12 denotes a dielectric layer formed on Al or Al alloy feature 10. A Cu or Cu alloy feature 11, comprising line 11A and via 11B, is electrically connected to Al or Al alloy feature 10 by a composite structure comprising a first layer 13 of Ta and Al. The layer 13 is initially deposited as Ta. Upon subsequent heating, as at about 350° C., Al diffuses from Al or Al alloy feature 10 into layer 13.

A second layer 14, comprising TaN with a relatively high nitrogen content of about 30 to about 40 at. %, is deposited on first layer 13, and a third layer 15, comprising TaN having a nitrogen content lower than that of second layer 14, preferably amorphous TaN, is deposited on second layer 14. Finally, a fourth layer 16 of Ta or TaN having a nitrogen content less than about 15 at. %, is deposited on third layer 15. The opening is then filled with Cu or Cu alloy and CMP is conducted to form the illustrated structure. It should be understood that lower feature 11 can comprise a Cu or Cu alloy metal feature, in which case the layers would be reversed, i.e. layer 16, comprising Ta or TaN having a nitrogen content of less than about 15 at. % would be initially deposited on the underlying Cu or Cu alloy feature 10. Layer 15, comprising amorphous TaN would then be deposited on layer 16. Layer 14, comprising polycrystalline TaN having a relatively high nitrogen content, would then be deposited on layer 15, and Ta layer 13 deposited on polycrystalline TaN layer 14. The opening would then be filled with Al or an Al alloy and CMP conducted. Upon subsequent heating, Al from the Al or Al alloy diffuses into layer 13 forming a thin Ta—Al barrier layer preventing further Al diffusion.

In the various embodiments of the present invention, conventional substrates and inter-layer dielectrics can be employed. For example, the substrate can be doped monocrystalline silicon or gallium-arsenide. The inter-layer dielectric employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. Interdielectric layers in accordance with the present invention can also comprise low dielectric constant materials, including polymers, such as polyimides. The opening formed in dielectric layers are effected by conventional photolithographic and etching techniques. The damascene openings encompassed by the present invention are not confined to dual damascene openings but encompass single damascene via/contact openings and trenches.

The present invention enables the effective electrical connection of Al or Al alloy features to Cu or Cu alloy features with high integrity by forming a composite structure therebetween which provides optimum electromigration resistance and barrier properties against Al and Cu diffusion, minimizes interconnect resistivity and prevents Kirkendal voiding. The present invention enjoys industrial applicability in forming various types of combined inlaid Cu an Cu alloy-Al or Al alloy interconnection patterns. The present invention is particularly applicable in manufacturing semiconductor devices with high speed circuitry and submicron features and high aspect ratio openings, e.g. semiconductor devices with a design rule of about 0.18 micron and under.

In the previous description, numerous specific details are set forth, such as specific material structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A semiconductor device comprising:
   an aluminum (Al) or Al alloy feature;
   a copper (Cu) or Cu alloy feature; and
   a composite electrically connecting the Al or Al alloy feature to the Cu or Cu alloy feature, the composite comprising:
   a first layer, comprising tantalum and aluminum, in contact with a surface of the Al or Al alloy feature;
   a second layer comprising tantalum nitride on the first layer;
   a third layer comprising tantalum nitride, having a nitrogen content less than the tantalum nitride of the second layer, on the second layer; and
   a fourth layer, comprising tantalum or tantalum nitride having a nitrogen content less than the tantalum nitride of the third layer, on the third layer and in contact with a surface the Cu or Cu alloy feature.

2. The semiconductor device according to claim 1, wherein:
   the first layer has a thickness of about 10 Å to about 100 Å;
   the second layer has a thickness of about 20 Å to about 250 Å;
   the third layer has a thickness of about 20 Å to about 250 Å ; and
   the fourth layer has a thickness of about 10 Å to about 150 Å.

3. The semiconductor device according to claim 1, wherein:
   the tantalum nitride of the second layer comprises about 30 to about 70 at. % nitrogen;
   the tantalum nitride of the third layer comprises about 15 to about 50 at. % nitrogen; and
   the fourth layer comprises tantalum or tantalum nitride having a nitrogen content less than about 15 at. %.

4. The semiconductor device according to claim 3, wherein:
   the tantalum nitride of the second layer is polycrystalline; and
   the tantalum nitride of the third layer is essentially amorphous.

5. The semiconductor according to claim 1, wherein:
   the Al or Al alloy feature comprises a lower conductive line;
   the Cu or Cu alloy feature comprises an upper line and via electrically connected by the composite to the lower Al or Al alloy line through a dielectric layer; and
   the composite layers extend between the via and the Al or Al alloy feature, between the via and dielectric layer and between the Cu or Cu alloy line and the dielectric layer.

6. The semiconductor device according to claim 1, wherein:
   the second layer is deposited on the first layer;
   the third layer is deposited on the second layer; and
   the fourth layer is deposited on the third layer.

7. A semiconductor device comprising:
   an aluminum (Al) or Al alloy feature;
   a copper (Cu) or Cu alloy feature; and
   a composite electrically connecting the Al or Al alloy feature to the Cu or Cu alloy feature, the composite comprising:
   a first layer, comprising tantalum and aluminum, in contact with a surface of the Al or Al alloy feature;
   a second layer comprising tantalum nitride on the first layer;
   a third layer comprising tantalum nitride, having a nitrogen content less than the tantalum nitride of the second layer, on the second layer; and
   a fourth layer, comprising tantalum or tantalum nitride having a nitrogen content less than the tantalum nitride of the third layer, on the third layer and in contact with a surface the Cu or Cu alloy feature, wherein:
   the tantalum nitride of the second layer is polycrystalline; and
   the tantalum nitride of the third layer is essentially amorphous.

8. A method of manufacturing a semiconductor device, the method comprising:
   forming an aluminum (Al) or an Al alloy feature;
   forming a composite comprising:
   a first layer comprising tantalum and aluminum in contact with a surface of the Al or Al alloy feature;
   a second layer comprising tantalum nitride on the first layer;
   a third layer, comprising tantalum nitride having a nitrogen content less than the tantalum nitride of the second layer, on the second layer; and
   a fourth layer, comprising tantalum or tantalum nitride having a nitrogen content less than the tantalum nitride of the third layer, on the third layer; and
   forming a copper (Cu) or Cu alloy feature in contact with the fourth layer and electrically connected to the Al or Al alloy feature by the composite.

9. The method according to claim 8, comprising sputter depositing the first, second third and fourth layers.

10. The method according to claim 8, further comprising heating to diffuse Al from the Al or Al alloy feature into the first layer.

11. The method according to claim 8, comprising:
    depositing the first layer at a thickness of about 10 Å to about 100 Å;
    depositing the second layer at a thickness of about 20 Å to about 250 Å;
    depositing the third layer at a thickness of about 20 Å to about 250 Å; and
    depositing the fourth layer at a thickness of about 10 Å to about 150 Å.

12. The method according to claim 8, wherein:
    the tantalum nitride of the second layer is polycrystalline; and
    the tantalum nitride of the third layer is essentially amorphous.

13. The method according to claim 10, comprising:
    depositing a dielectric layer on the Al or Al alloy feature:
    forming a dual damascene opening in the dielectric layer, the opening comprising a lower via hole section exposing the Al or Al alloy feature and an upper trench section communicating with the via hole section;
    depositing the first layer lining the opening and on the dielectric layer;
    depositing the second layer on the first layer;
    depositing the third layer on the second layer;
    depositing the fourth layer on the third layer;
    filling the dual damascene opening with Cu or a Cu alloy to form the Cu or Cu alloy feature; and chemical mechanical polishing to form an upper Cu or Cu alloy line substantially coplanar with the dielectric layer and a Cu or Cu alloy via electrically connected to the Al or Al alloy line through the composite.

14. A method of manufacturing a semiconductor device, the method comprising:

forming an aluminum (Al) or an Al alloy feature;

forming a composite comprising:
  a first layer comprising tantalum and aluminum in contact with a surface of the Al or Al alloy feature;
  a second layer comprising tantalum nitride on the first layer;
  a third layer, comprising tantalum nitride having a nitrogen content less than tantalum nitride of the second layer, on the second layer; and
  a fourth layer, comprising tantalum or tantalum nitride having a nitrogen content less than the tantalum nitride of the third layer, on the third layer; and forming a copper (Cu or Cu alloy feature in contact with the fourth layer and electrically connected to the Al or Al alloy feature by the composite, wherein:
  the tantalum nitride of the second layer comprises about 30 to about 70 at. % nitrogen;
  the tantalum nitride of the third layer comprises about 15 to about 50 at. % nitrogen; and
  the fourth layer comprises tantalum or tantalum nitride having a nitrogen content less than about 15 at. %.

15. The method according to claim 14, wherein:
the tantalum nitride of the second layer is polycrystalline; and
the tantalum nitride of the third layer is essentially amorphous.

16. A method of manufacturing a semiconductor device, the method comprising:

forming a copper (Cu) or Cu alloy feature;

forming a composite comprising:
  a first layer comprising tantalum or tantalum nitride in contact with a surface of the Cu or Cu alloy feature;
  a second layer, comprising tantalum nitride having a nitrogen content greater than that of the first layer, on the first layer;
  a third layer, comprising tantalum nitride having a nitrogen content greater than that of the second layer, on the second layer; and
  a fourth layer comprising tantalum on the third layer;

forming an aluminum (Al) or Al alloy feature in contact with the fourth layer and electrically connected to the Cu or Cu alloy feature by the composite; and heating to diffuse Al from the Al or Al alloy feature into the fourth layer.

17. The method according to claim 16, comprising:

depositing the first layer to a thickness of about 10 Å to about 150 Å;

depositing the second layer to a thickness of about 20 Å to about 250 Å;

depositing the third layer to a thickness of about 20 Å 250 Å; and depositing the fourth layer to a thickness of about 10 Å to about 100 Å.

18. The method according to claim 17, wherein:

the first layer comprises tantalum or tantalum nitride having a nitrogen content less than about 15 at. %;

the tantalum nitride of the second layer comprises about 15 to about 40 at. % nitrogen; and the tantalum nitride of the third layer comprises about 30 to about 40 at. % nitrogen.

19. The method according to claim 17, wherein:

the tantalum nitride of the second layer is essentially amorphous; and the tantalum nitride of the third layer is polycrystalline.

20. The method according to claim 19, wherein:

the tantalum nitride of the second layer is essentially amorphous; and the tantalum nitride of the third layer is polycrystalline.

* * * * *